United States Patent
Murotani

(10) Patent No.: US 7,605,213 B2
(45) Date of Patent: *Oct. 20, 2009

(54) SEMICONDUCTOR ENCAPSULANT OF EPOXY RESIN, PHENOLIC RESIN, PHOSPHINE-QUINONE ADDUCT AND OH COMPOUND

(75) Inventor: Kazuyoshi Murotani, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 291 days.

This patent is subject to a terminal disclaimer.

(21) Appl. No.: 11/491,244

(22) Filed: Jul. 21, 2006

(65) Prior Publication Data

US 2007/0027273 A1 Feb. 1, 2007

(30) Foreign Application Priority Data

Jul. 29, 2005 (JP) ............................ P2005-220499

(51) Int. Cl.
*C08K 3/36* (2006.01)
*C08L 63/04* (2006.01)
*H01L 23/29* (2006.01)

(52) U.S. Cl. ........................ 525/485; 257/793; 523/457; 523/458; 523/466

(58) Field of Classification Search ........................ None
See application file for complete search history.

(56) References Cited

U.S. PATENT DOCUMENTS 7,023,098 B2 * 4/2006 Umeno et al. ................ 257/787
2006/0094797 A1 * 5/2006 Murotani et al. ............ 523/400

FOREIGN PATENT DOCUMENTS

| JP | 01-275618 | | 11/1989 |
| JP | 05-097965 | | 4/1993 |
| JP | 05-097967 | | 4/1993 |
| JP | 2003-212958 | | 7/2003 |
| JP | 2003-212958 A | * | 7/2003 |
| JP | 2004-035781 | | 2/2004 |
| JP | 2004-35781 A | * | 2/2004 |
| JP | 2006-111672 A | * | 4/2006 |

* cited by examiner

*Primary Examiner*—Robert Sellers
(74) *Attorney, Agent, or Firm*—Smith, Gambrell & Russell, LLP

(57) ABSTRACT

There is provided an epoxy resin composition for encapsulating a semiconductor essentially comprising (A) a phenolaralkyl type epoxy resin having a phenylene structure, (B) a phenolaralkyl resin having a biphenylene structure, (C) a curing accelerator containing an adduct of a phosphine compound and a quinone compound, (D) a compound in which hydroxyl groups are attached to each of two or more adjacent carbon atoms of an aromatic ring, (E) a silane coupling agent and (F) an inorganic filler, wherein the inorganic filler (F) is contained in 84 wt % to 92 wt % both inclusive in the total amount of the epoxy resin composition.

12 Claims, 1 Drawing Sheet

SEMICONDUCTOR ENCAPSULANT OF EPOXY RESIN, PHENOLIC RESIN, PHOSPHINE-QUINONE ADDUCT AND OH COMPOUND

This application is based on Japanese patent application NO. 2005-220499, the content of which is incorporated hereinto by reference.

BACKGROUND OF THE INVENTION

1. Field of the Invention

The present invention relates to an epoxy resin composition for encapsulating a semiconductor and a semiconductor device using the same.

2. Description of the Related Art

Electronic components such as diodes, transistors and integrated circuits have been typically encapsulated with an epoxy resin composition. Particularly, in integrated circuits, there have been used epoxy resin compositions exhibiting excellent heat resistance and moisture resistance containing an epoxy resin, a phenol resin, and inorganic fillers such as fused silica and crystalline silica. However, recent market trend to size reduction, weight saving and higher performance in electronic devices has led to more integrated semiconductors and accelerated surface mounting of a semiconductor device, while an epoxy resin composition used for encapsulating a semiconductor element has been required to meet increasingly stricter conditions. In particular, now that surface mounting of a semiconductor device is common, a moistened semiconductor device is exposed to a high temperature during a solder reflow process. Furthermore, as part of eliminating environment burden materials, a lead-free solder has been increasingly used as an alternative material, but has a higher melting point than that of a conventional solder. Therefore, it needs a reflow temperature during surface mounting higher by about 20° C. than a conventional case, specifically 260° C. Thus, a semiconductor device is exposed to a further higher temperature, causing delamination of a cured epoxy resin composition in its interface with a semiconductor element or lead frame. It tends to defects significantly deteriorating reliability in a semiconductor device such as cracks.

An epoxy resin composition frequently contains halogen-containing flame retardant such as bromine-containing organic compounds and an antimony compound such as diantimony trioxide and diantimony tetroxide for making it flame-resistant, but in the light of eliminating environment burden materials, there have been needs for developing an epoxy resin composition exhibiting excellent flame resistance without a halogen-containing flame retardant or antimony compound. As alternative environmentally-benign flame retardant, metal hydroxides such as aluminum hydroxide and magnesium hydroxide have been used. They must be, however, used in a large amount for serving as a flame retardant. When being used in an enough amount to obtain required flame retardant property, it may deteriorate fluidity of an epoxy resin composition during molding, mechanical strength of a curing or cured material and thus solder-reflow resistance.

To solve these problems, there have been proposed using a low water-absorbing, flexible and flame-resistant resin for improving solder reflow resistance (See, for example, Japanese Laid-open Publication No. 1-275618, Japanese Laid-open Publication No. 5-097965, and Japanese Laid-open Publication No. 5-097967). However, such technique cannot be practically used because increase in a content of an inorganic filler for using a lead-free solder causes inadequate fluidity.

Given such circumstances, there has been needed for developing a resin composition for encapsulating a semiconductor exhibiting higher flame resistance, good fluidity and adequately higher solder-reflow resistance to allow for the use of a lead-free solder without a flame retardant.

The present invention has been achieved for resolving the above problems. Thus, an object of the invention is to provide a resin composition for encapsulating a semiconductor exhibiting higher flame resistance, good fluidity and adequately higher solder-reflow resistance to allow for the use of a lead-free solder without a flame retardant, as well as a highly reliable semiconductor device in which a semiconductor element is encapsulated with such a composition.

SUMMARY OF THE INVENTION

According to the present invention, there are provided the followings.

[1] An epoxy resin composition for encapsulating a semiconductor essentially comprising (A) an epoxy resin represented by general formula (1), (B) a phenol resin represented by general formula (2), (C) a curing accelerator containing an adduct of a phosphine compound and a quinone compound, (D) a compound in which hydroxyl groups are attached to each of two or more adjacent carbon atoms of an aromatic ring, (E) a silane coupling agent and (F) an inorganic filler, wherein the inorganic filler (F) is contained in 84 wt % to 92 wt % both inclusive in the total amount of the epoxy resin composition:

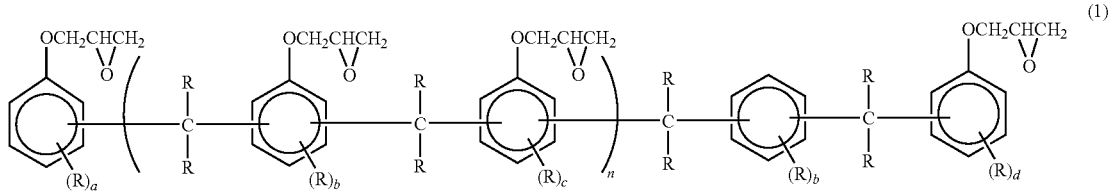

wherein Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less;

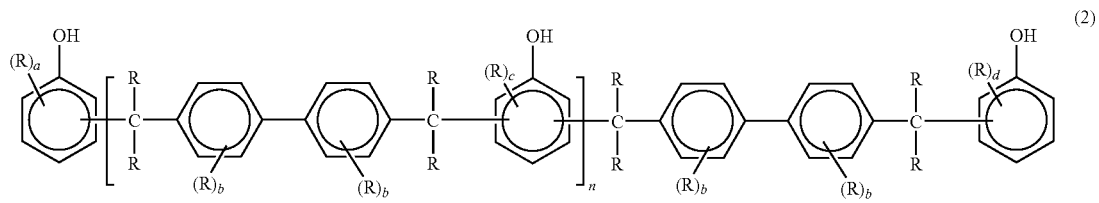

wherein Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

[2] The epoxy resin composition for encapsulating a semiconductor as described in [1], wherein the epoxy resin represented by general formula (1) (A) has a softening point of 35° C. to 60° C. both inclusive.

[3] The epoxy resin composition for encapsulating a semiconductor as described in [1] or [2], wherein the adduct of a phosphine compound and a quinone compound (C) is an adduct of triphenylphosphine with 1,4-benzoquinone.

[4] The epoxy resin composition for encapsulating a semiconductor as described in any of [1] to [3], wherein the compound in which hydroxyl groups are attached to each of two or more adjacent carbon atoms of an aromatic ring (D) is a compound in which hydroxyl groups are attached to each of two or more adjacent carbon atoms of a benzene or naphthalene ring.

[5] The epoxy resin composition for encapsulating a semiconductor as described in [4], wherein the compound in which hydroxyl groups are attached to each of two or more adjacent carbon atoms of a benzene ring is selected from the group consisting of catechol, pyrogallol, gallic acid, gallates and derivatives thereof.

[6] The epoxy resin composition for encapsulating a semiconductor as described in [4], wherein the compound in which hydroxyl groups are attached to each of two or more adjacent carbon atoms of a naphthalene ring is selected from the group consisting of 1,2-dihydroxynaphthalene, 2,3-dihydroxynaphthalene and derivatives thereof.

[7] A semiconductor device wherein a semiconductor element is encapsulated with the epoxy resin composition for encapsulating a semiconductor as described in any of [1] to [6].

According to the present invention, there can be provided, in good productivity, an epoxy resin composition for encapsulating a semiconductor having a flame resistance grade of V-0 in accordance with UL-94, good fluidity and an adequately high solder reflow resistance to allow for the use of a lead-free solder without a halogen-containing flame retardant, an antimony compound or other flame retardant, as well as a highly reliable semiconductor device in which a semiconductor element is encapsulated with the composition. Thus, the epoxy resin composition for encapsulating a semiconductor according to the invention can be suitably used for manufacturing an industrial resin-encapsulating type semiconductor device, particularly a resin-encapsulating type semiconductor device for surface mounting where a lead-free solder is used.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1:
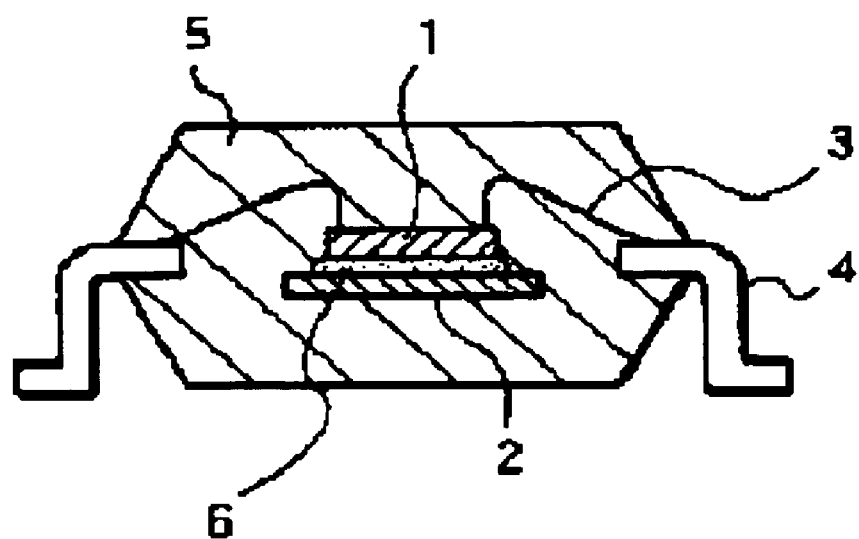
FIG. 1 is a cross-sectional view showing a configuration of a semiconductor device according to an embodiment of the present invention.

The invention will be now described herein with reference to illustrative embodiments. Those skilled in the art will recognize that many alternative embodiments can be accomplished using the teachings of the present invention and that the invention is not limited to the embodiments illustrated for explanatory purpose.

This invention provides an epoxy resin composition for encapsulating a semiconductor having a flame resistance grade of V-0 in accordance with UL-94, good fluidity and an adequately high solder reflow resistance to allow for the use of a lead-free solder without a halogen-containing flame retardant, an antimony compound or other flame retardant, essentially comprising (A) an epoxy resin represented by general formula (1), (B) a phenol resin represented by general formula (2), (C) a curing accelerator containing an adduct of a phosphine compound and a quinone compound, (D) a compound in which hydroxyl groups are attached to each of two or more adjacent carbon atoms of an aromatic ring, (E) a silane coupling agent and (F) an inorganic filler, wherein the inorganic filler (F) is contained in 84 wt % to 92 wt % both inclusive in the total amount of the epoxy resin composition.

The individual components will be detailed.

An epoxy resin represented by general formula (1) used in the invention gives a cured material exhibiting lower hygroscopicity because its resin backbone is hydrophobic and a lower elastic modulus at a solder reflow temperature because the cured material has a longer distance between cross-linking points, advantageously resulting in less generation of stress, good adhesiveness and thus higher solder reflow resistance. Furthermore, the resin itself is highly flame resistant because an aromatic-ring content in the resin backbone is high. The epoxy resin represented by general formula (1) used in the invention has a softening point of 35° C. to 60° C. both inclusive, preferably 40° C. to 55° C. both inclusive. A softening point of the epoxy resin of general formula (1) within the above range may lead to good curability and improved fluidity.

In general formula (1), Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less. Among these, for example, a resin represented by formula (3) is preferable in the light of curability. An "n" within the above range may prevent reduction in fluidity of a resin composition during encapsulating/molding due to increase in a resin viscosity, allowing an inorganic filler to be filled at a higher rate for further lowering moisture absorption.

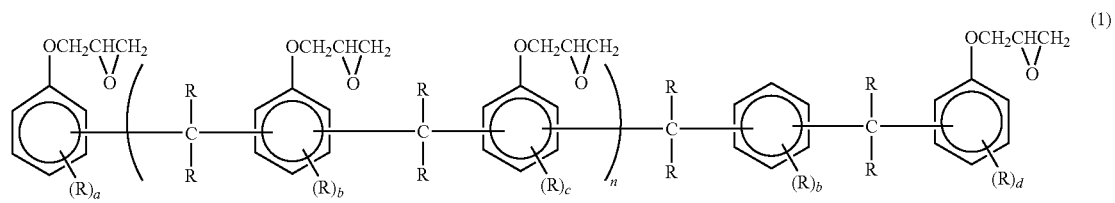

In general formula (1), Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

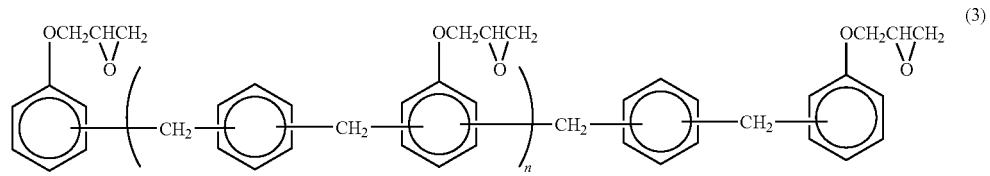

In formula (3), n is an average and 0 or a positive number of 10 or less.

In the invention, another epoxy resin may be used in combination with the epoxy resin represented by formula (1) as long as it does not deteriorate the effects of the use of the epoxy resin (1). Epoxy resins which can be used generally include monomers, oligomers and polymers having two or more intramolecular epoxy groups, but there are no particular restrictions to their molecular weight or molecular structure. Examples include phenol novolac type epoxy resins, ortho-cresol novolac type epoxy resins, naphthol novolac type epoxy resins, phenol aralkyl type epoxy resins having a biphenylene structure, naphthol aralkyl type epoxy resins (having, for example, a phenylene or biphenyl structure), dicyclopentadiene-modified phenol type epoxy resins, stilbene type epoxy resins, triphenolmethane type epoxy resins, alkyl-modified triphenolmethane type epoxy resins and triazine-core containing epoxy resins, which may be used alone or in combination of two or more. When another epoxy resin is used with the epoxy resin (1), a content of the epoxy resin represented by general formula (1) is preferably 70 wt % to 100 wt % both inclusive to the total amount of the epoxy resins. A content of the epoxy resin represented by general formula (1) within the range may result in satisfactorily lower hygroscopicity and good solder reflow resistance.

A phenol resin represented by general formula (2) used in the invention has a hydrophobic and rigid biphenylene structure between phenolic hydroxyl groups. A cured material obtained from an epoxy resin composition containing those resin exhibits lower hygroscopicity and a lower elastic modulus in a high temperature range above its glass-transition temperature due to a long distance between cross-linking points in the cured material, advantageously resulting in less generation of stress, good adhesiveness and thus higher solder reflow resistance. Furthermore, the phenol resin itself has high flame resistance because an aromatic-ring content in the resin backbone is high and exhibits higher heat resistance despite its lower crosslink density.

In general formula (2), Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less. Among these, for example, a resin represented by formula (4) is preferable in the light of curability. An "n" within the above range may lead to reduction in fluidity of a resin composition during encapsulating/molding due to increase in a resin viscosity, allowing an inorganic filler to be filled at a higher rate for further lowering moisture absorption.

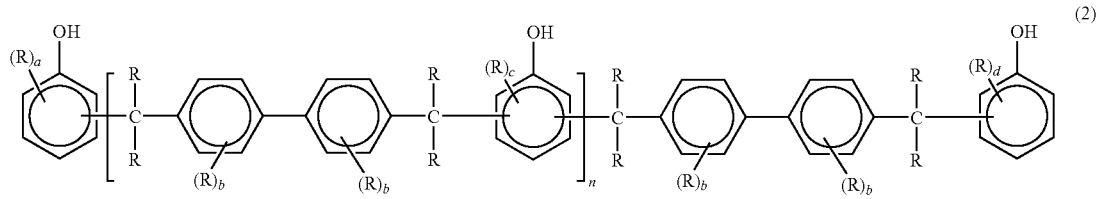

In general formula (2), Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

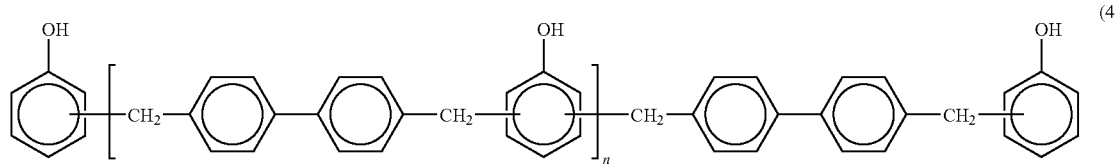

In formula (4), n is an average and 0 or a positive number of 10 or less.

In the present invention, another phenol resin may be used in combination with the phenol resin represented by general formula (2) as long as it does not deteriorate the effects of the use of the phenol resin (2). Phenol resins which can be used with the phenol resin (2) generally include monomers, oligomers and polymers having two or more intramolecular phenolic hydroxyl groups, but there are no particular restrictions to their molecular weight or molecular structure. Examples include phenol novolac resins, cresol novolac resins, naphthol aralkyl resins, triphenolmethane resins, terpene-modified phenol resins, dicyclopentadiene-modified phenol resins and phenol aralkyl resins having a phenylene structure, which may be used alone or in combination of two or more. When another phenol resin is used with the phenol resin represented by general formula (2), a content of the phenol resin (2) is preferably 70 wt % to 100 wt % both inclusive to the total amount of the phenol resins. A content of the phenol resin represented by general formula (2) within the above range may result in satisfactorily lower hygroscopicity and good solder reflow resistance.

In the present invention, an equivalent ratio of epoxy groups in the total epoxy resins to phenolic hydroxy groups in the total phenolic resins is preferably 0.5 to 2.0 both inclusive, particularly preferably 0.7 to 1.5 both inclusive. An equivalent ration within the above range may prevent moisture resistance or curability from being deteriorated.

The epoxy resin represented by general formula (1) and the phenol resin represented by general formula (2) used in the invention may be preliminarily melt-mixed before use for improving dispersibility. Particularly, when the epoxy resin represented by general formula (1) having a softening point of 45° C. or lower is used, it can be preliminarily melt-mixed with the phenol resin represented by general formula (2) to make a softening point of the molten mixture higher than that of the original epoxy resin represented by general formula (1), resulting in improvement of handling properties of the starting materials.

A curing accelerator used in the invention essentially contains an adduct of a phosphine compound with a quinone compound. A phosphine compound includes triphenylphosphine, tri-p-tolylphosphine, diphenylcyclohexylphosphine, tricyclohexylphosphine, tributylphosphine and the like. A quinone compound includes 1,4-benzoquinone, methyl-1,4-benzoquinone, methoxy-1,4-benzoquinone, phenyl-1,4-benzoquinone, 1,4-naphthoquinone and the like. Among adducts of the phosphine compound with the quinone compound, a 1,4-benzoquinone adduct of triphenylphosphine is preferable. An adduct of a phosphine compound with a quinone compound may be prepared by, for example, conducting an addition reaction of the phosphine compound and quinone compounds as starting materials in an organic solvent capable of dissolving both and then isolating a product, but not limited to. Adducts of a phosphine compound with a quinone compound may be used alone or in combination of two or more.

In addition to an adduct of a phosphine compound with a quinone compound, another curing accelerator may be used without particular restrictions as long as it can accelerate a reaction between an epoxy group and a phenolic hydroxyl group. A content of an adduct of a phosphine compound with a quinone compound is preferably 50 wt % or more to the total amount of curing accelerators. Examples of a curing accelerator other than adducts of a phosphine compound with a quinone compound include diazabicycloalkenes such as 1,8-diazabicyclo(5,4,0)undec-7-ene and derivatives thereof; amine compounds such as tributylamine and benzyldimethylamine; imidazole compounds such as 2-methylimidazole; organophosphines such as triphenylphosphine and methyldiphenylphosphine; and tetra-substituted phosphonium tetra-substituted borates such as tetraphenylphosphonium tetraphenylborate, tetraphenylphosphonium tetrabenzoic acid borate, tetraphenylphosphonium tetranaphthoic acid borate, tetraphenylphosphonium tetranaphthoyloxyborate and tetraphenylphosphonium tetranaphthyloxyborate, which may be used alone or in combination of two or more. A content of a curing accelerator used in the invention is 0.01 wt % to 3.00 wt % both inclusive to the total amount of the epoxy resin composition. A phenol resin content within the above rage may provide good curing properties.

A compound in which hydroxyl groups are attached to each of two or more adjacent carbon atoms of an aromatic ring used in the invention may have a substituent other than hydroxyl. The compound in which hydroxyl groups are attached to each of two or more adjacent carbon atoms of an aromatic ring may be a monocyclic compound represented by general formula (5) or a polycyclic compound represented by general formula (6).

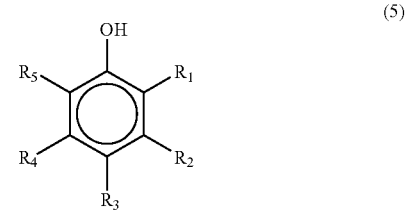

In general formula (5), one of $R_1$ and $R_5$ is hydroxyl and the other is hydrogen, hydroxyl or a substituent other than hydroxyl; and $R_2$, $R_3$ and $R_4$ are hydrogen, hydroxyl or a substituent other than hydroxyl.

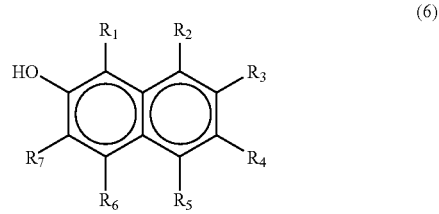

In general formula (6), one of $R_1$ and $R_7$ is hydroxyl and the other is hydrogen, hydroxyl or a substituent other than hydroxyl; and $R_2$, $R_3$, $R_4$, $R_5$ and $R_6$ are hydrogen, hydroxyl or a substituent other than hydroxyl.

Specific examples of the monocyclic compound represented by general formula (5) include catechol, pyrogallol, gallic acid, gallates and derivatives thereof. Specific examples of the polycyclic compound represented by general formula (6) include 1,2-dihydroxynaphthalene, 2,3-dihydroxynaphthalene and derivatives thereof. Preferred is a compound in which hydroxyl groups are attached to each of two adjacent carbon atoms of an aromatic ring, in the light of controllability of fluidity and curing properties. Considering volatilization during a kneading process, the compound more preferably has a naphthalene ring as a main structure because of low volatility and good weighing stability. Here, the compound in which hydroxyl groups are attached to each of two or more adjacent carbon atoms of an aromatic ring may be a compound having a naphthalene ring such as 1,2-dihydroxynaphthalene, 2,3-dihydroxynaphthalene and derivatives thereof. These compounds in which hydroxyl groups are attached to each of two or more adjacent carbon atoms as members of an aromatic ring may be used in combination of two or more.

A content of a compound in which hydroxyl groups are attached to each of two or more adjacent carbon atoms of an aromatic ring is 0.01 wt % to 1 wt % both inclusive, preferably 0.03 wt % to 0.8 wt % both inclusive, particularly preferably 0.05 wt % to 0.5 wt % both inclusive to the total amount of the epoxy resin composition. A content of the compound in which hydroxyl groups are attached to each of two or more adjacent carbon atoms of an aromatic ring within the above range may reduce a viscosity and increase fluidity because of a synergistic effect with a silane coupling agent described below and does not interfere with curing of an epoxy resin composition, resulting in maintenance of its performance as a resin for encapsulating a semiconductor.

A silane coupling agent used in the invention may be selected from, for example, epoxy silanes, aminosilanes, ureidosilanes and mercaptosilanes, but any silane coupling agent may be used without particular restrictions as long as it reacts between the epoxy resin composition and the inorganic filler to improve interfacial strength of the epoxy resin composition and the inorganic filler. Since the compound in which hydroxyl groups are attached to each of two or more adjacent carbon atoms of an aromatic ring considerably improve viscosity properties and flowing properties by its synergistic effect with a silane coupling agent, the silane coupling agent is essential for adequately enjoying the effects of the compound in which hydroxyl groups are attached to each of two or more adjacent carbon atoms of an aromatic ring. These silane coupling agents may be used alone or in combination of two or more. A content of a silane coupling agent used in the invention is 0.01 wt % to 1 wt % both inclusive, preferably 0.05 wt % to 0.8 wt % both inclusive, particularly preferably 0.1 wt % to 0.6 wt % both inclusive in the total amount of the epoxy resin composition. A content of a silane coupling agent within the above range may lead to the adequate effects of the compound in which hydroxyl groups are attached to each of two or more adjacent carbon atoms of an aromatic ring and to preventing deterioration in solder reflow resistance in a semiconductor package due to reduced adhesiveness between a cured epoxy resin composition and a variety of substrates or to preventing reduction in solder reflow resistance in a semiconductor package due to increase in water absorption of the epoxy resin composition.

An inorganic filler used in the invention may be selected without restrictions from those generally used for a encapsulating material. These may include fused silica, crystalline silica, secondary aggregated silica, alumina, titanium white, aluminum hydroxide, talc, clay and glass fiber, which may be used alone or in combination of two or more. Fused silica is particularly preferable. Fused silica may be in the form of milled particles or spheres. More preferably, spherical silica may be used for increasing its content and minimizing increase in a melt viscosity of an epoxy resin composition. Furthermore, in order to increase a content of spherical silica, it is desirable to adjust a size distribution of the spherical silica to be relatively wider. In the light of balance between moldability and reliability, a content of the total inorganic filler is essentially 84 wt % to 92 wt % both inclusive, preferably 87 wt % to 92 wt % both inclusive in the total amount of the epoxy resin composition. A content of an inorganic filler within the above range may allow the epoxy resin composition to exhibit good solder resistance with low hygroscopicity and reduced thermal expansion and prevent defects such as inadequate filling during encapsulating/molding due to reduced fluidity of the epoxy resin composition or gold-wire sweeping within a semiconductor device due to increased viscosity of the epoxy resin composition.

An epoxy resin composition of the invention contains components (A) to (F) and may contain, as needed, various additives including a coloring agent such as carbon black and colcothar; a low-stress component such as a silicone oil and silicone rubber; a mold release such as natural waxes, synthetic waxes, higher fatty acids and their metal salts and paraffins; an inorganic ion exchanger such as bismuth oxide hydrate; and an antioxidant as appropriate. Furthermore, as needed, the inorganic filler may be preliminarily surface-treated with a coupling agent, an epoxy resin or a phenol resin. Such surface treatment may be conducted by, for example, mixing it with a solvent and then removing the solvent, or directly adding it to an inorganic filler and mixing the mixture by a mixer.

An epoxy resin composition used in the present invention can be prepared by mixing components (A) to (F) and other additives at an ambient temperature using a mixer, melt-kneading the mixture using a kneading machine such as a roller, a kneader and an extruder, and then milling the product after cooling.

For manufacturing a semiconductor device by encapsulating an electric part such as a semiconductor element with an epoxy resin composition of the invention, molding can be conducted using of conventional process such as transfer molding, compression molding and injection molding.

FIG. 1 is a cross-sectional view showing a configuration of a semiconductor device using the epoxy resin composition of the present invention. A semiconductor chip 1 is mounted on a die pad 2 via cured die bonding material 6. An electrode pad of the semiconductor chip 1 is connected to a lead frame 4 through gold-wire 3. The semiconductor chip 1 is encapsulated with cured encapsulating material 5.

EXAMPLES

This invention will be described with reference to, but not limited to, Examples. Here, any content shall be expressed as part(s) by weight.

Example 1

Epoxy resin 1: an epoxy resin represented by formula (3) (softening point: 44° C., epoxy equivalent: 234, n=1.5 in formula (3)): 6.43 parts by weight;

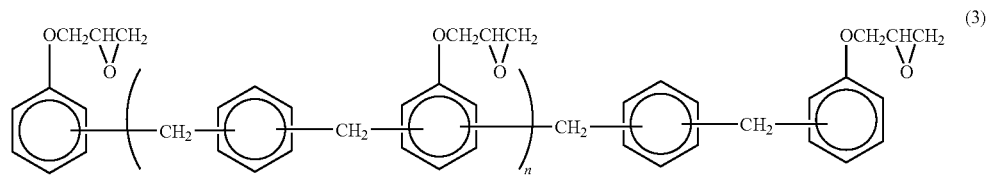

Phenol resin 1: a phenol resin represented by formula (4) (softening point: 107° C., hydroxyl equivalent: 203, n=0.5 in formula (4)): 4.42 parts by weight;

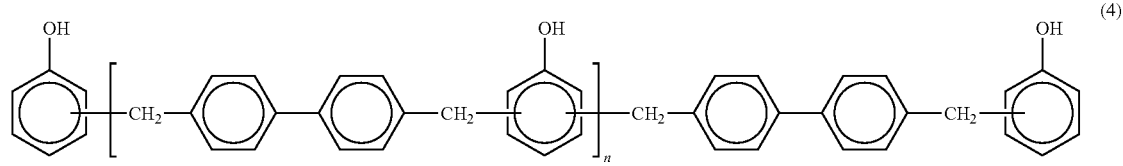

Curing accelerator 1: 1,4-benzoquinone adduct of triphenylphosphine: 0.20 parts by weight;

2,3-Dihydroxynaphthalene: 0.05 parts by weight;

Silane coupling agent 1: γ-glycidylpropyltrimethoxysilane: 0.20 parts by weight;

Fused spherical silica (average particle size: 25 μm) 88.00 parts by weight;

Carnauba wax: 0.30 parts by weight;

Carbon black: 0.40 parts by weight.

These components were blended by a mixer. Then, the mixture was kneaded using two rolls whose surface temperatures were 90° C. and 25° C. After cooling, the mixture was milled to give an epoxy resin composition. The epoxy resin composition thus obtained was evaluated for its properties by the following method. The results are shown in Table 1.

Evaluation Method

Spiral flow: Using a low-pressure transfer molding machine, an epoxy resin composition was injected into a mold for measuring a spiral flow in accordance with EMMI-1-66 under the conditions of a mold temperature of 175° C., an injection pressure of 9.8 MPa and a curing time of 120 sec to determine a flow length, which is expressed in centimeter. When it is 80 cm or less, molding defects such as gold-wire sweeping and an unfilled package may be caused.

Curability (gelation time): 30 g of an epoxy resin composition was placed on a hot plate at 175° C. and kneaded by a metal spatula to determine a gelation time. A molding time in a common transfer molding is about 50 to 120 sec both inclusive. A gelation time of 45 sec or more may, therefore, cause molding defects.

Heat resistance: Using a transfer molding machine, a test piece (127 mm×12.7 mm×1.6 mm) was molded under the conditions of a molding temperature of 175° C., an injection pressure of 9.8 MPa and a curing time of 120 sec, and then as after-baking, heated at 175° C. for 8 hours. ΣF and $F_{max}$ were determined in accordance with the UL-94 vertical burn test for evaluating flame resistance.

Solder reflow resistance: 80 pQFP (Copper frame: 14 mm×20 mm×2 mm (thickness), pad size: 8 mm×8 mm, chip size: 7 mm×7 mm) was encapsulated and molded with a encapsulating resin in any of Examples and Comparative Examples using a low-pressure transfer auto-molding machine under the conditions of a mold temperature of 175° C., an injection pressure of 9.6 MPa and a curing time of 90 sec, post-cured at 175° C. for 4 hours. Each of 16 samples was processed at a temperature of 85° C. and a relative humidity of 60% for 168 hours and then at a temperature of 85° C. and a relative humidity of 85% for 168 hours. Then, assuming mounting using a lead-free solder, it was treated by IR reflow (260° C.) for 10 sec. Resulting semiconductor devices shown in FIG. 1 were observed by an ultrasonic detector to determine the presence of internal cracks and various interfacial delamination. A sample with one internal crack or interfacial delamination was rejected as a defective package. When the number of defective packages is n, the result is expressed as n/16.

Examples 2 to 13 and Comparative Examples 1 to 9

According to the compounding rates in Tables 1, 2 and 3, epoxy resin compositions were prepared and evaluated as described in Example 1. The results are shown in Tables 1, 2 and 3.

In Tables 1 to 3, "On-chip delamination" means delamination occurred at the interface between the chip 1 and the cured encapsulating material 5, "On-pad delamination" means delamination occurred at the interface between the top surface of die pad 2 (around the chip 1 in the surface of the die pad 2 on which the chip 1 is mounted) and the cured encapsulating material 5, "Back-pad delamination" means delamination occurred at the interface between the bottom surface of die pad 2 (opposite surface of the surface on which the chip is mounted) and the cured encapsulating material 5, and "Inner-lead delamination" means delamination occurred at the interface between the encapsulated part of the lead frame 4 and the cured encapsulating material 5.

Starting materials used in Examples other than Example 1 are as follows.

Epoxy resin 2: an epoxy resin represented by formula (3) (softening point: 55° C., epoxy equivalent: 236, n=1.9 in formula (3));

$$\text{(3)}$$

[Chemical structure: a polymer with OCH₂CHCH₂O glycidyl ether groups on phenyl rings connected by CH₂ linkages, repeating unit n]

Epoxy resin 3: a biphenyl type epoxy resin (YukaShell Epoxy KK., YX-4000L, epoxy equivalent: 185, melting point: 105° C.);

Epoxy resin 4: a bisphenol-A type epoxy resin (Japan Epoxy Resin Co., Ltd., YL-6810, epoxy equivalent: 170/eq, melting point: 47° C.);

Phenol resin 2: a paraxylene-modified novolac type phenol resin (Mitsui Chemicals Inc., XLC-4L, hydroxyl equivalent: 168, softening point: 62° C.);

Curing accelerator 2: triphenylphosphine;

1,2-Dihydroxynaphthalene;
Catechol;
Pyrogallol;
1,6-Dihydroxynaphthalene;
Resorcinol;

Silane coupling agent 2: N-phenyl-γ-aminopropyltrimethoxysilane;

Silane coupling agent 3: γ-Glycidylpropyltrimethoxysilane.

TABLE 1

|  | Examples | | | | | | |
| --- | --- | --- | --- | --- | --- | --- | --- |
|  | 1 | 2 | 3 | 4 | 5 | 6 | 7 |
| Epoxy resin 1 | 6.43 |  | 4.21 | 4.13 | 6.58 | 6.41 | 6.43 |
| Epoxy resin 2 |  | 6.45 |  |  |  |  |  |
| Epoxy resin 3 |  |  | 2.00 |  |  |  |  |
| Epoxy resin 4 |  |  |  | 2.00 |  |  |  |
| Phenol resin 1 | 4.42 | 4.40 | 4.64 | 4.72 | 2.77 | 4.44 | 4.42 |
| Phenol resin 2 |  |  |  |  | 1.50 |  |  |
| Curing accelerator 1 | 0.20 | 0.20 | 0.20 | 0.20 | 0.20 | 0.15 | 0.20 |
| Curing accelerator 2 |  |  |  |  |  | 0.05 |  |
| 2,3-Dihydroxynaphthalene | 0.05 | 0.05 | 0.05 | 0.05 | 0.05 | 0.05 |  |
| 1,2-Dihydroxynaphthalene |  |  |  |  |  |  | 0.05 |
| Silane coupling agent 1 | 0.20 | 0.20 | 0.20 | 0.20 | 0.20 | 0.20 | 0.20 |
| Fused spherical silica | 88.00 | 88.00 | 88.00 | 88.00 | 88.00 | 88.00 | 88.00 |
| Carnauba wax | 0.30 | 0.30 | 0.30 | 0.30 | 0.30 | 0.30 | 0.30 |
| Carbon black | 0.40 | 0.40 | 0.40 | 0.40 | 0.40 | 0.40 | 0.40 |
| Spiral flow [cm] | 120 | 100 | 120 | 120 | 110 | 90 | 120 |
| Gelation time [sec] | 35 | 37 | 38 | 35 | 33 | 32 | 34 |
| Flame resistance (3.2 mm thick) | V-0 | V-0 | V-0 | V-0 | V-0 | V-0 | V-0 |
| Solder reflow resistance — Crack | 0/16 | 0/16 | 0/16 | 0/16 | 0/16 | 0/16 | 0/16 |
| On-Chip delamination | 0/16 | 0/16 | 0/16 | 0/16 | 0/16 | 0/16 | 0/16 |
| On-Pad delamination | 0/16 | 0/16 | 0/16 | 0/16 | 0/16 | 0/16 | 0/16 |
| Back-pad delamination | 0/16 | 0/16 | 0/16 | 0/16 | 0/16 | 0/16 | 0/16 |
| Inner-lead delamination | 0/16 | 0/16 | 0/16 | 0/16 | 0/16 | 0/16 | 0/16 |

TABLE 2

|  | Examples | | | | | |
| --- | --- | --- | --- | --- | --- | --- |
|  | 8 | 9 | 10 | 11 | 12 | 13 |
| Epoxy resin 1 | 6.43 | 6.43 | 6.43 | 6.43 | 8.19 | 5.25 |
| Phenol resin 1 | 4.42 | 4.42 | 4.42 | 4.42 | 5.66 | 3.60 |
| Curing accelerator 1 | 0.20 | 0.20 | 0.20 | 0.20 | 0.20 | 0.20 |
| 2,3-Dihydroxynaphthalene |  |  | 0.05 | 0.05 | 0.05 | 0.05 |
| Catechol | 0.05 |  |  |  |  |  |
| Pyrogallol |  | 0.05 |  |  |  |  |
| Silane coupling agent 1 | 0.20 | 0.20 |  |  | 0.20 | 0.20 |
| Silane coupling agent 2 |  |  | 0.20 |  |  |  |
| Silane coupling agent 3 |  |  |  | 0.20 |  |  |
| Fused spherical silica | 88.00 | 88.00 | 88.00 | 88.00 | 85.00 | 90.00 |
| Carnauba wax | 0.30 | 0.30 | 0.30 | 0.30 | 0.30 | 0.30 |
| Carbon black | 0.40 | 0.40 | 0.40 | 0.40 | 0.40 | 0.40 |
| Spiral flow [cm] | 115 | 120 | 115 | 115 | 140 | 90 |
| Gelation time [sec] | 35 | 35 | 36 | 35 | 38 | 36 |
| Flame resistance (3.2 mm thick) | V-0 | V-0 | V-0 | V-0 | V-0 | V-0 |
| Solder reflow resistance — Crack | 0/16 | 0/16 | 0/16 | 0/16 | 0/16 | 0/16 |
| On-Chip delamination | 0/16 | 0/16 | 0/16 | 0/16 | 0/16 | 0/16 |
| On-Pad | 0/16 | 0/16 | 0/16 | 0/16 | 0/16 | 0/16 |

TABLE 2-continued

|  | Examples | | | | | |
| --- | --- | --- | --- | --- | --- | --- |
|  | 8 | 9 | 10 | 11 | 12 | 13 |
| delamination | | | | | | |
| Back-pad delamination | 0/16 | 0/16 | 0/16 | 0/16 | 0/16 | 0/16 |
| Inner-lead delamination | 0/16 | 0/16 | 1/16 | 2/16 | 1/16 | 0/16 |

TABLE 3

|  | Comparative Examples | | | | | | | | |
| --- | --- | --- | --- | --- | --- | --- | --- | --- | --- |
|  | 1 | 2 | 3 | 4 | 5 | 6 | 7 | 8 | 9 |
| Epoxy resin 1 |  |  | 6.85 | 6.36 | 6.43 | 6.43 | 6.54 | 10.53 | 3.49 |
| Epoxy resin 3 | 5.79 |  |  |  |  |  |  |  |  |
| Epoxy resin 4 |  | 5.59 |  |  |  |  |  |  |  |
| Phenol resin 1 | 5.06 | 5.26 |  | 4.49 | 4.42 | 4.42 | 4.51 | 7.32 | 2.36 |
| Phenol resin 2 |  |  | 4.00 |  |  |  |  |  |  |
| Curing accelerator 1 | 0.20 | 0.20 | 0.20 |  | 0.20 | 0.20 | 0.20 | 0.20 | 0.20 |
| Curing accelerator 2 |  |  |  | 0.20 |  |  |  |  |  |
| 2,3-Dihydroxynaphthalene | 0.05 | 0.05 | 0.05 | 0.05 |  |  | 0.05 | 0.05 | 0.05 |
| 1,6-Dihydroxynaphthalene |  |  |  |  | 0.05 |  |  |  |  |
| Resorcinol |  |  |  |  |  | 0.05 |  |  |  |
| Silane coupling agent 1 | 0.20 | 0.20 | 0.20 | 0.20 | 0.20 | 0.20 |  | 0.20 | 0.20 |
| Fused spherical silica | 88.00 | 88.00 | 88.00 | 88.00 | 88.00 | 88.00 | 88.00 | 81.00 | 93.00 |
| Carnauba wax | 0.30 | 0.30 | 0.30 | 0.30 | 0.30 | 0.30 | 0.30 | 0.30 | 0.30 |
| Carbon black | 0.40 | 0.40 | 0.40 | 0.40 | 0.40 | 0.40 | 0.40 | 0.40 | 0.40 |
| Spiral flow [cm] | 160 | 165 | 90 | 65 | 80 | 80 | 75 | 135 | 40 |
| Gelation time [sec] | 60 | 58 | 34 | 25 | 30 | 31 | 35 | 41 | 34 |
| Flame resistance (3.2 mm thick) | V-1 | V-1 | V-1 | V-0 | V-0 | V-0 | V-0 | Burnout | V-0 |
| Solder reflow resistance  Crack | 0/16 | 0/16 | 0/16 | 0/16 | 0/16 | 0/16 | 0/16 | 16/16 | Not moldable |
|  On-Chip delamination | 0/16 | 0/16 | 16/16 | 8/16 | 9/16 | 8/16 | 0/16 | 16/16 |  |
|  On-Pad delamination | 0/16 | 16/16 | 16/16 | 11/16 | 5/16 | 7/16 | 16/16 | 16/16 |  |
|  Back-pad delamination | 0/16 | 16/16 | 16/16 | 16/16 | 5/16 | 6/16 | 16/16 | 16/16 |  |
|  Inner-lead delamination | 0/16 | 0/16 | 16/16 | 16/16 | 8/16 | 8/16 | 16/16 | 16/16 |  |

All of Examples 1 to 13 showed excellent fluidity, curability, flame resistance and solder reflow resistance. Comparative Examples 1 and 2 without an epoxy resin represented by general formula (1) showed inadequate curability and flame resistance. Comparative Example 2 also showed inadequate solder reflow resistance. Comparative Example 3 without a phenol resin represented by general formula (2) showed inadequate flame resistance and solder reflow resistance. Comparative Example 4 using a curing accelerator other than an adduct of a phosphine compound and a quinone compound showed poor fluidity and inadequate solder reflow resistance. Comparative Examples 5 and 6 without a compound in which hydroxyl groups are attached to each of two or more adjacent carbon atoms of an aromatic ring showed poor fluidity and inadequate solder reflow resistance. Comparative Example 7 without a silane coupling agent showed poor fluidity and inadequate solder reflow resistance. Comparative Example 8 with an insufficient content of the inorganic filler showed inadequate flame resistance and solder reflow resistance. Comparative Example with an excessive amount of the inorganic filler showed significant fluidity reduction and viscosity increase, so that a satisfactory molding was not obtained in package molding. The above results indicate that an epoxy resin composition of the invention can be used to achieve satisfactory flame resistance without a halogen-containing flame retardant, an antimony compound or other flame retardants and to provide a resin composition for encapsulating a semiconductor having good fluidity and higher solder reflow resistance allowing for the use of a lead-free solder.

An epoxy resin composition for encapsulating a semiconductor prepared according to the present invention has a flame resistance grade of V-0 in accordance with UL-94, good fluidity and an adequately high solder reflow resistance to allow for the use of a lead-free solder without a halogen-containing flame retardant, an antimony compound or other flame retardant, and thus can be suitably used for manufacturing an industrial resin-encapsulating type semiconductor device, particularly a resin-encapsulating type semiconductor device for surface mounting where a lead-free solder is used.

It is apparent that the present invention is not limited to the above embodiment, that may be modified and changed without departing from the scope and spirit of the invention.

What is claimed is:

1. An epoxy resin composition for encapsulating a semiconductor comprising (A) an epoxy resin represented by general formula (1), (B) a phenol resin represented by general formula (2), (C) a curing accelerator containing an adduct of a phosphine compound and a quinone compound, (D) a compound in which hydroxyl groups are attached to each of two or more adjacent carbon atoms of an aromatic ring, (E) a silane coupling agent and (F) an inorganic filler, wherein the inorganic filler (F) is contained in 84 wt % to 92 wt % both inclusive in the total amount of the epoxy resin composition:

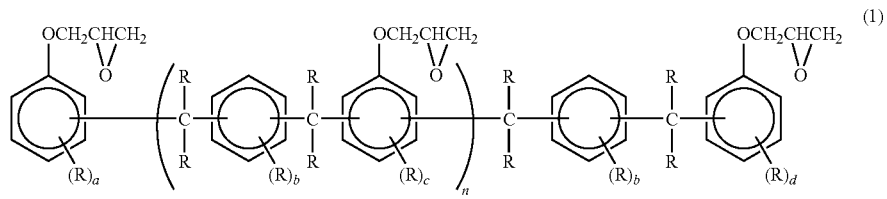

wherein Rs, which are the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less;

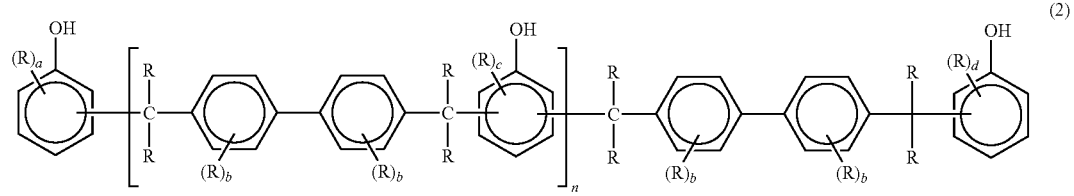

wherein Rs, which are the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

2. The epoxy resin composition for encapsulating a semiconductor as claimed in claim 1, wherein the epoxy resin represented by general formula (1) (A) has a softening point of 35° C. to 60° C. both inclusive.

3. The epoxy resin composition for encapsulating a semiconductor as claimed in claim 1, wherein the adduct of a phosphine compound and a quinone compound (C) is an adduct of triphenylphosphine with 1,4-benzoquinone.

4. The epoxy resin composition for encapsulating a semiconductor as claimed in claim 1, wherein the compound in which hydroxyl groups are attached to each of two or more adjacent carbon atoms of an aromatic ring (D) is a compound in which hydroxyl groups are attached to each of two or more adjacent carbon atoms of a benzene or naphthalene ring.

5. The epoxy resin composition for encapsulating a semiconductor as claimed in claim 4, wherein the compound in which hydroxyl groups are attached to each of two or more adjacent carbon atoms of a benzene ring is selected from the group consisting of catechol, pyrogallol, gallic acid, gallates and derivatives thereof.

6. The epoxy resin composition for encapsulating a semiconductor as claimed in claim 4, wherein the compound in which hydroxyl groups are attached to each of two or more adjacent carbon atoms of a naphthalene ring is selected from the group consisting of 1,2-dihydroxynaphthalene, 2,3-dihydroxynaphthalene and derivatives thereof.

7. A semiconductor device wherein a semiconductor element is encapsulated with the epoxy resin composition for encapsulating a semiconductor as claimed in claim 1.

8. The epoxy resin composition for encapsulating a semiconductor as claimed in claim 2, wherein the adduct of a phosphine compound and a quinone compound (C) is an adduct of triphenylphosphine with 1,4-benzoquinone.

9. The epoxy resin composition for encapsulating a semiconductor as claimed in claim 2, wherein the compound in which hydroxyl groups are attached to each of two or more adjacent carbon atoms of an aromatic ring (D) is a compound in which hydroxyl groups are attached to each of two or more adjacent carbon atoms of a benzene or naphthalene ring.

10. The epoxy resin composition for encapsulating a semiconductor as claimed in claim 3, wherein the compound in which hydroxyl groups are attached to each of two or more adjacent carbon atoms of an aromatic ring (D) is a compound in which hydroxyl groups are attached to each of two or more adjacent carbon atoms of a benzene or naphthalene ring.

11. An epoxy resin composition for encapsulating a semiconductor comprising (A) an epoxy resin represented by general formula (1), (B) a phenol resin represented by general formula (2), (C) a curing accelerator containing an adduct of a phosphine compound and a quinone compound, (D) a compound in which hydroxyl groups are attached to each of two or more adjacent carbon atoms of a benzene ring or a naphthalene ring, (E) a silane coupling agent and (F) an inorganic filler, wherein the inorganic filler (F) is contained in 84 wt % to 92 wt % both inclusive in the total amount of the epoxy resin composition:

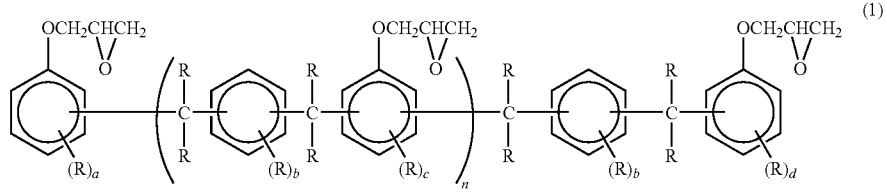

wherein Rs, which are the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less;

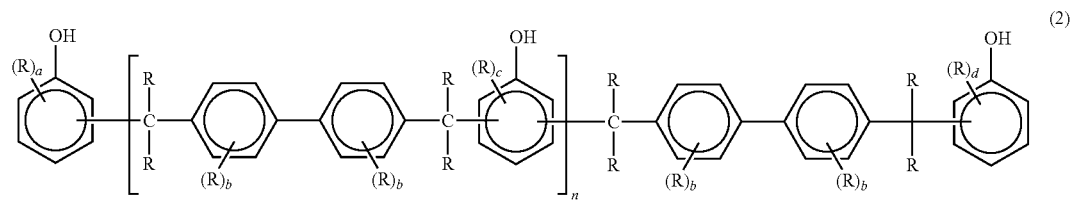

wherein Rs, which are the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

12. An epoxy resin composition for encapsulating a semiconductor comprising (A) an epoxy resin represented by general formula (1), (B) a phenol resin represented by general formula (2), (C) a curing accelerator containing an adduct of a phosphine compound and a quinone compound, (D) a compound in which hydroxyl groups are attached to each of two or more adjacent carbon atoms of a naphthalene ring, (E) a silane coupling agent and (F) an inorganic filler, wherein the inorganic filler (F) is contained in 84 wt % to 92 wt % both inclusive in the total amount of the epoxy resin composition:

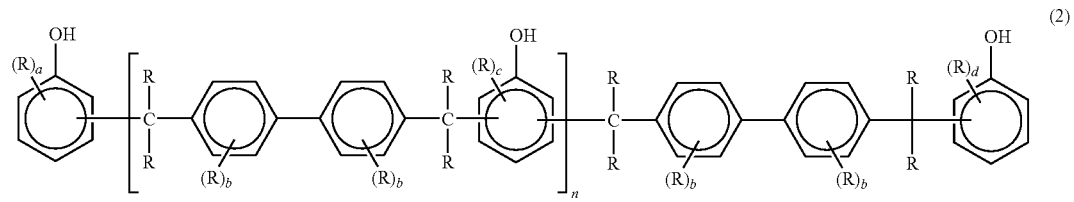

wherein Rs, which are the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less;

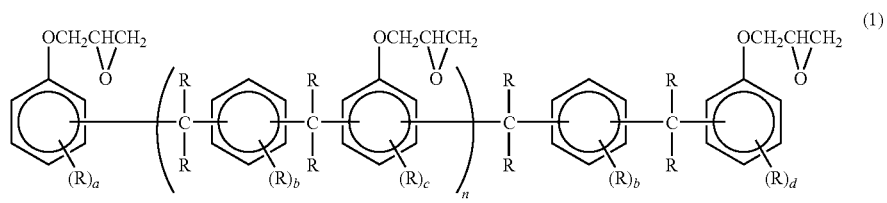

wherein Rs, which may be the same or different, represent hydrogen or alkyl having 1 to 4 carbon atoms; a is an integer of 0 to 4; b is an integer of 0 to 4; c is an integer of 0 to 3; d is an integer of 0 to 4; and n is an average and 0 or a positive number of 10 or less.

* * * * *